United States Patent [19]
Hsue et al.

[11] Patent Number: 5,521,113
[45] Date of Patent: May 28, 1996

[54] PROCESS FOR FORMING A BUTTING CONTACT THROUGH A GATE ELECTRODE

[75] Inventors: Chen-Chiu Hsue; Sun-Chieh Chien, both of Hsin-Chu, Taiwan

[73] Assignee: United Microelectronics Corporation, Hsinchu, Taiwan

[21] Appl. No.: 405,078

[22] Filed: Mar. 16, 1995

[51] Int. Cl.[6] .............................. H01L 21/70; H01L 27/00
[52] U.S. Cl. ............................. 437/52; 437/47; 437/228; 148/DIG. 20
[58] Field of Search .................................. 437/47, 48, 52, 437/80, 919, 228, 195; 257/903–904; 148/DIG. 20

[56] References Cited

U.S. PATENT DOCUMENTS 4,785,341  11/1988  Ning et al. .................................. 357/44
5,422,499  6/1995  Manning ..................................... 257/67

*Primary Examiner*—H. Jey Tsai
*Attorney, Agent, or Firm*—George O. Saile; Graham S. Jones, II

[57] ABSTRACT

An SRAM cell includes a semiconductor substrate doped with a dopant of a first type, a highly doped region in the substrate implanted with a dopant of opposite type, a gate oxide layer on the substrate, a first conductive layer formed upon the gate oxide layer, a dielectric layer deposited over the first conductive layer, an opening in the gate oxide layer, the first conductive layer, and the dielectric layer, and a second conductive layer deposited upon the dielectric layer.

19 Claims, 13 Drawing Sheets

PROCESS FOR FORMING A BUTTING CONTACT THROUGH A GATE ELECTRODE

BACKGROUND OF THE INVENTION

1. Field of the Invention

This invention relates to SRAM cells and more particularly to a process for fabrication thereof.

2. Description of Related Art

U.S. Pat. No. 4,785,341 of Ning et al for "Interconnection of Opposite Conductivity Type Semiconductor Regions" describes a butting contact structure for SRAM circuit connections.

FIGS. 9A–9C are cross sectional views starting with a semiconductor substrate with a buried contact opening formed in a gate oxide layer and illustrating the process flow of a prior art buried contact process.

In FIG. 9A, a P– substrate 90 is covered with a gate oxide 91 with an opening 92 therethrough down to P– doped silicon substrate 90.

In FIG. 9B, the device of FIG. 9A after an N+ region 93 has been formed below opening 92, followed by the deposit of a blanket first polysilicon layer 94 thereon which is doped conventionally.

In FIG. 9C, the device of FIG. 9B has been coated with a mask 95 over first polysilicon layer 94 with an edge thereof located over N+ region 93 and hole 92. The mask 95 is a patterned photoresist layer 95 adapted for use during etching away the first polysilicon layer 94 at the edge of the opening 92. In view of misalignment of the mask 95 with the edge of opening 92, a trench 96 is formed where the bottom contact opening 92 is open and the photoresist mask as did not provide protection, because the polysilicon etching process which should be stopped by the gate oxide 91, instead, because of the misalignment, etches the N+ and P– silicon substrate during the overetching period.

SUMMARY OF THE INVENTION

1. Silicon trenches induce node leakage current, especially for low power SRAM applications. Please note that trenches are a source of damage.
2. Polysilicon gates have a overetch limitation (the longer the over etch, the deeper the trench) due to trench depth control, then occasionally a stringer problem exists, so the process margin can improve. The stringer problem refers to "stringers" which are unwanted process generated polysilicon bridges produced during the etching of polysilicon.

The problems solved by the present invention are as follows:

1. The butting contact (i.e. a contact which connects two different layers, substrates together, by using one of the layers or by using a third layer) is covered by the first polysilicon layer. Accordingly, there is an improved margin of accuracy of the etching process for the polysilicon gate. There is no trench in the butting contact process. Thus the polysilicon overetch can be increased reducing the stringer problem.
2. There is no silicon trench on the SRAM cell so the node leakage current is reduced which is a significant improvement. The prior art is a buried contact SRAM in which the trench in the buried contact area cannot be avoided. The instant invention is a non-trench process which has no trench related damage.

In accordance with this invention, a method of manufacture of an SRAM cell is provided. Form a gate oxide layer on a semiconductor substrate doped with a dopant of a first type with a field oxide region on at least one end of the gate oxide layer. Form a first mask over the device including the field oxide region and the gate oxide layer with a mask opening located over the gate oxide layer. Perform an ion implantation of ions through the mask opening into the substrate to form a highly doped region of an opposite type to the first type located below the gate oxide layer. Remove the first mask. Form a first conductive layer upon the gate oxide layer. Form a second mask over the first conductive layer leaving unwanted portions of the first conductive layer exposed. Etch away the unwanted portions of the first conductive layer exposing portions of the gate oxide layer below the unwanted portions providing a first electrode. Remove the second mask. Deposit a dielectric layer over the device. Form a third mask over the dielectric layer with an opening therein leaving an unwanted portion of the dielectric layer exposed. Etch away the unwanted portion of the dielectric layer, the first conductive layer and the gate oxide layer down to the doped region in the substrate through the opening in the third mask forming a butting contact opening therein; and form a second conductive layer upon the dielectric layer extending down through the butting contact opening into contact with the first conductive layer and into contact with the doped region.

Preferably, after removal of the second mask a second ion lightly doped ion implantation is performed forming a lightly doped region in the substrate adjacent to the doped region using the first electrode as a self-aligned mask, the doping of the lightly doped region including a dose of N-type ions implanted within the range between about $1\times10^{13}/cm^2$ and about $5\times10^{13}/cm^2$ at between about 50 keV and about 120 keV. The dopant of the first type is P type material and the dopant of the second type is N type material. A lightly doped level of dopant is formed in the substrate adjacent to the highly doped region. A spacer structure is formed adjacent to the edge of the first conductive layer, on the gate oxide layer subsequent to the lightly doped ion implantation. An additional high level of dopant is implanted into the substrate adjacent to the lightly doped region aside from the spacer using the electrode combined with the spacer as a self-aligned mask to protect portion of the substrate including the doped region and a portion of the lightly doped region from the additional level of dopant. The highly doped region is formed between field oxide structures at the periphery of the gate oxide layer.

In accordance with another aspect of this invention a method of manufacture of an SRAM cell is provided. Form a gate oxide layer on a semiconductor substrate doped with a dopant of a first type. Form a first mask over the device including the gate oxide layer with a mask opening located over the gate oxide layer. Perform an ion implantation of ions through the mask opening into the substrate to form a highly doped region of an opposite type to the first type located below the gate oxide layer. Remove the first mask. Form a first conductive layer upon the gate oxide layer. Form a second mask over the first conductive layer leaving unwanted portions of the first conductive layer exposed. Etch away the unwanted portions of the first conductive layer exposing portions of the gate oxide layer below the unwanted portions providing a first electrode. Remove the second mask. Form an additional blanket dielectric layer over the device covering the device including first electrode;

and form a third mask over the additional dielectric layer with an opening therein leaving an unwanted portion of the additional dielectric layer exposed. Then etch an opening through the unwanted portion of the additional dielectric layer, etching through the first conductive layer and etching through the gate oxide layer down to the doped region in the substrate through the opening in the third mask forming a butting contact opening therein. Then, form a second conductive layer upon the dielectric layer extending down through the butting contact opening into contact with the first conductive layer.

Preferably, prior to removal of the second mask a second ion lightly doped ion implantation is performed forming a lightly doped region in the substrate adjacent to the highly doped region using the first electrode as a self-aligned mask; the dopant of the first type is P type material; and the dopant of the second type is N type material.

Preferably, following removal of the second mask a dielectric spacer layer is deposited over the device. Then etch the device to form a spacer from the dielectric spacer layer at the end of the first electrode and to strip exposed portions of the gate oxide layer. Perform a highly doped ion implantation of ions into the substrate to form a second highly doped region of an opposite type to the first type located below the gate oxide layer, aside from the spacer using the electrode combined with the spacer as a self-aligned mask to protect portions of the substrate including the doped region from the additional level of dopant, and when the additional dielectric layer is deposited the additional dielectric layer covers the spacer and the lightly doped region and second highly doped region.

Preferably, the dopant of the first type is P type material; the dopant of the second type is N type material; the first ion implantation includes a dose of arsenic (As) ions implanted within the range between about $5 \times 10^{14}/cm^2$ and about $5 \times 10^{15}/cm^2$ at between about 50 keV and about 120 keV; the lightly doped region ion implantation includes a dose of $P^{31}$ ions implanted within the range between about $1 \times 10^{13}/cm^2$ and about $5 \times 10^{13}/cm^2$ at between about 40 keV and about 80 keV; the second highly doped region includes ion implantation includes a dose of arsenic (As) ions implanted within the range between about $5 \times 10^{14}/cm^2$ and about $55 \times 10^{15}/cm^2$ at between about 50 keV and about 80 keV.

Preferably, a spacer structure is formed adjacent to the edge of the first conductive layer, on the gate oxide layer subsequent to the lightly doped ion implantation; a lightly doped level of dopant is formed in the substrate adjacent to the highly doped region.

In accordance with another aspect of this invention, a method of manufacture of an SRAM cell is provided. First form a gate oxide layer on a semiconductor substrate doped with a P− dopant with FOX regions on either end of the gate oxide layer. Form a first mask over the FOX regions and the gate oxide layer with a first mask opening located over the gate oxide layer. Perform an ion implantation of N+ ions through the first mask opening into the substrate to form a highly doped N+ region located below the gate oxide layer. Remove the first mask. Form a second mask over the gate oxide layer leaving unwanted areas of the gate oxide layer exposed. Etch away the unwanted areas of the gate oxide layer. Remove the second mask. Form a first conductive layer upon the gate oxide layer. Form a third mask over the first conductive layer leaving unwanted areas of the first conductive layer exposed. Etch away the unwanted areas of the first conductive layer to form a patterned edge of the first conductive layer. Perform a lightly doped N− region in the substrate adjacent to edge of the first conductive layer which serves as a self-aligned mask. Form a dielectric spacer on the edge of the first conductive layer. Performing an ion implantation of N+ ions forming a second highly doped N+ region in the substrate adjacent to the edge and the spacer with the second highly doped N+ region is contiguous to the second N+ region. Deposit a dielectric layer over the patterned first conductive layer; and form an opening in the dielectric layer to the first conductive layer and depositing a second conductive layer into the opening.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
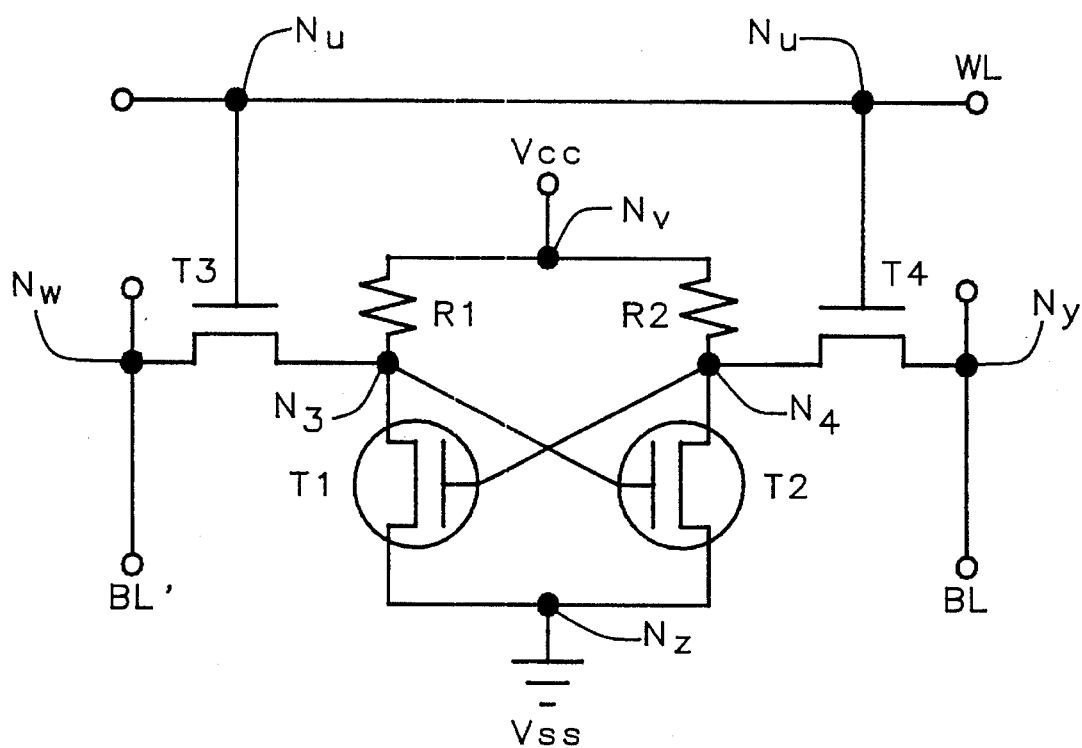
FIG. 1 shows a schematic circuit diagram of an SRAM device in accordance with this invention.

FIG. 1 shows a schematic circuit diagram of an SRAM device in accordance with this invention. For operation of an SRAM cell the leakage current of nodes N3 and N4 should be kept as low as possible. Bitlines BL and BL' are connected to nodes Nw and Ny respectively. A word line WL is connected at node Nu to the gates of FET transistors T3 and T4. The source/drain circuit of transistor T3 is connected between nodes Nw and N3. The source/drain circuit of transistor T4 is connected between nodes N4 and Ny. Nodes N3 and N4 are connected respectively by resistors R1 and R2 to node Nv, which, in turn, is connected to voltage source Vcc. Node Nz is connected to voltage Vss, which is the reference potential. The source/drain circuit of transistor T1 is connected between node Nz and node N3. The source/drain circuit of transistor T2 is connected between node Nz and node N4. Node N4 is also connected to the gate of the transistor T1. The gate of transistor T2 is connected to node N3.

Figure 2:
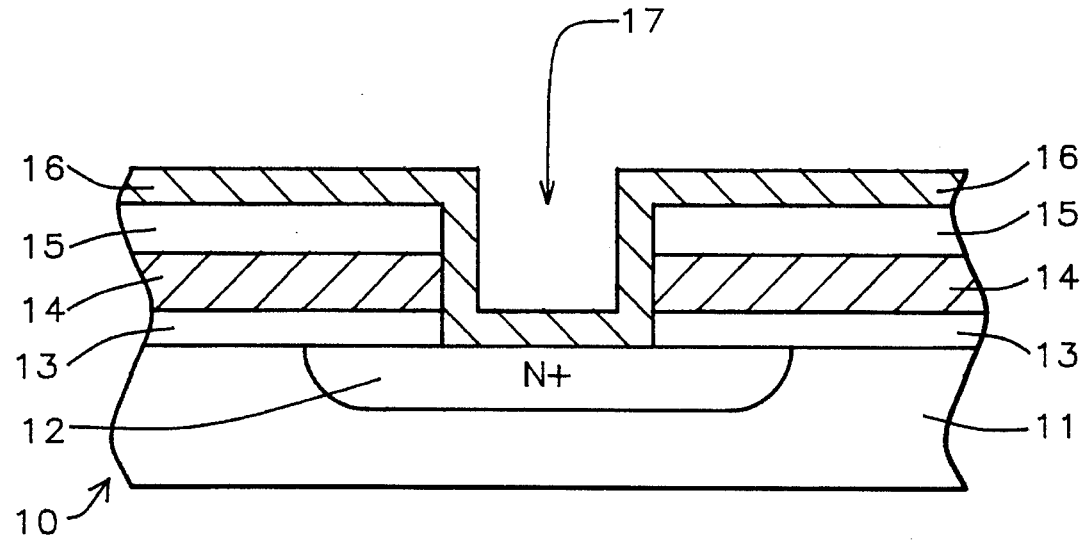
FIG. 2 shows a cross sectional schematic view of a semiconductor device 10 in accordance with this invention, showing a portion of the circuit of FIG. 1.

FIG. 2 shows a cross sectional schematic view of a semiconductor device 10 in accordance with this invention, showing a portion of the circuit of FIG. 1. The device 10 includes a substrate 11 comprising a P doped silicon semiconductor. A buried N+ region 12 is formed in the substrate 11. Upon the substrate 11 is formed a gate oxide layer 13. Upon the gate oxide layer 13 is formed a first polysilicon layer 14, which in turn is coated by silicon dioxide layer 15. A hole 17 has been formed through layers 13, 14 and 15 down to substrate 11 shown centered upon the N+ region 12. A second polysilicon layer 16 has been deposited over the silicon dioxide layer 15 and down into hole 17 over the N+region 12 of substrate 11 forming a butting contact between the N+ region 12 and extends the second polysilicon layer 16.

Figure 8:
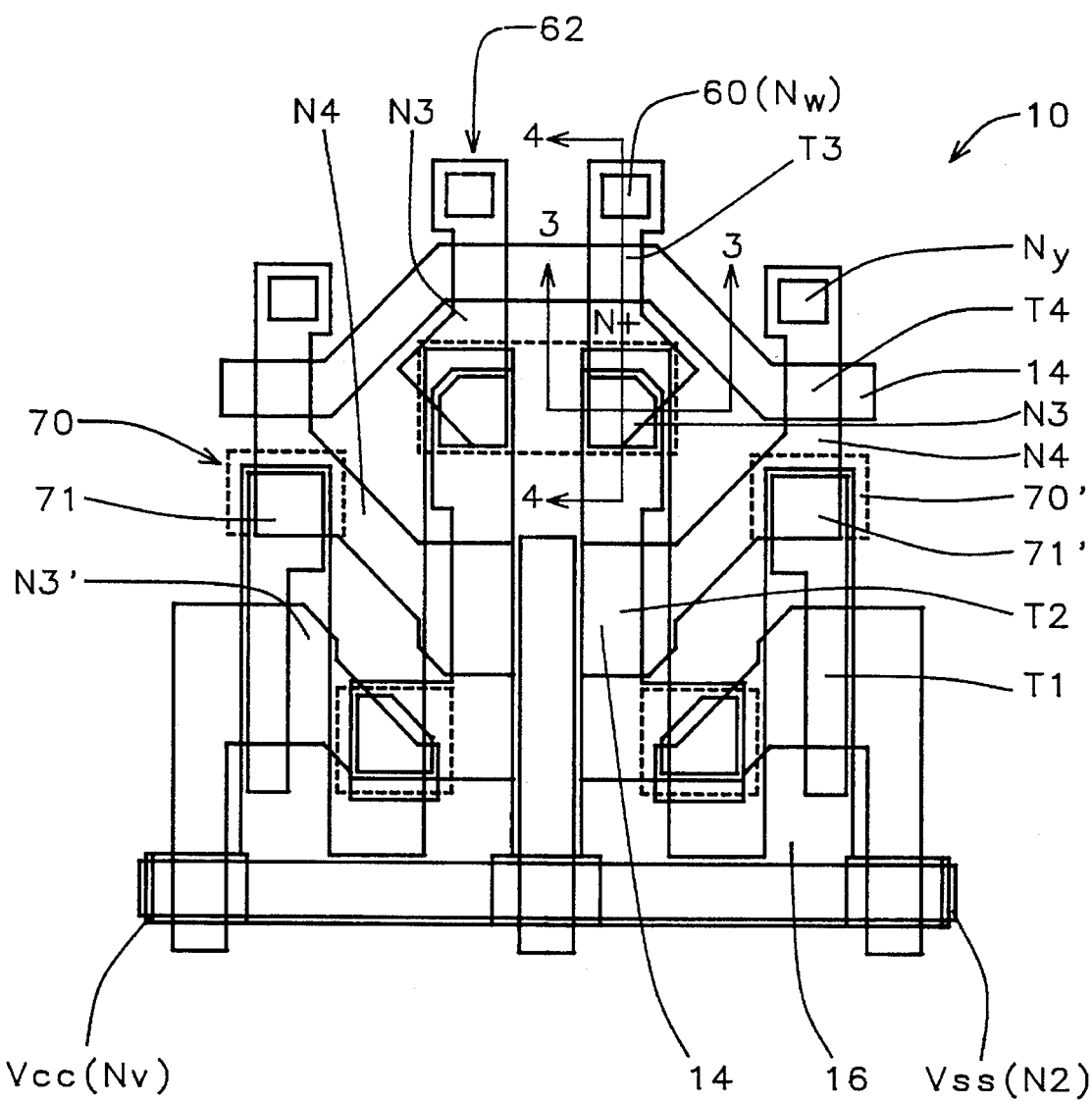
FIG. 8 shows a representational plan view of a device made in accordance with this invention embodying the circuit of FIG. 1.
Figure 9A:
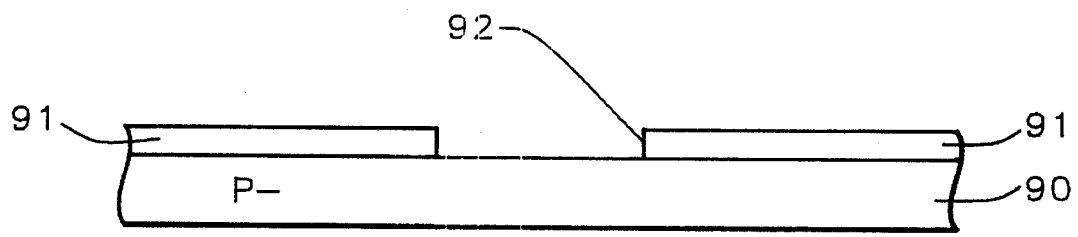
FIGS. 9A–9C are cross sectional views starting with a semiconductor substrate with a buried contact opening formed in a gate oxide layer and illustrating the process flow of a prior art buried contact process.
Figure 9B:
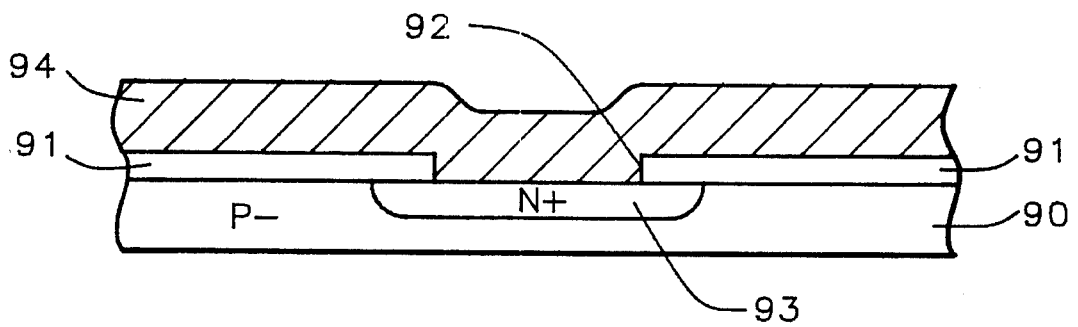
Figure 9C:
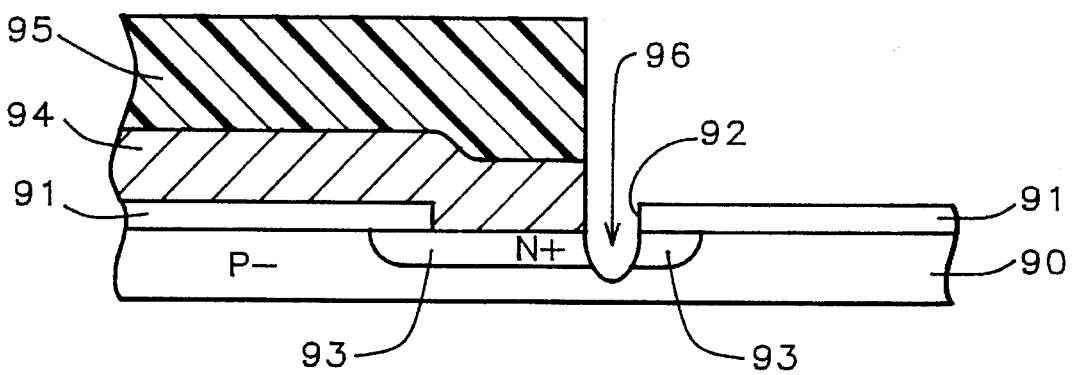

FIGS. 3A–3H are sectional schematic views of the device 10 of FIG. 2 showing the process flow in various stages of fabrication, taken along section line 3—3 in FIG. 8.

Figure 3A:
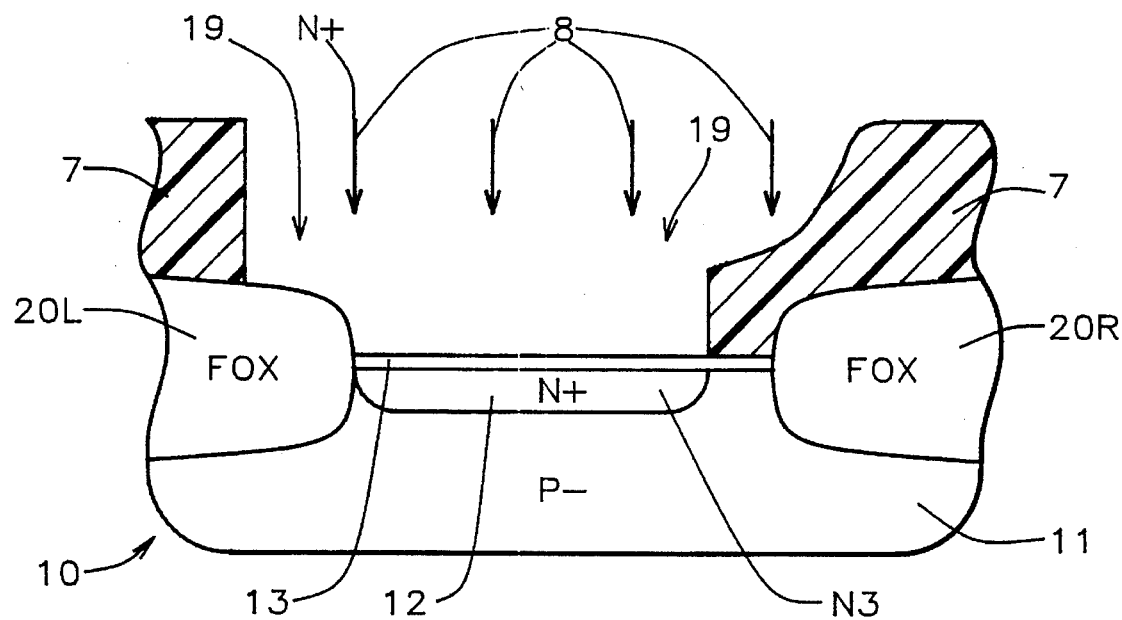
FIGS. 3A–3H are sectional schematic views of the device of FIG. 2 showing the process flow in various stages of fabrication, taken along section line 3—3 in FIG. 8.

FIG. 3A shows the initial portion of the process of forming device 10 of FIG. 2. The substrate 11 is shown with the gate oxide layer 13 on the surface thereof with FOX regions 20L on the left and 20R on the right end of the gate oxide layer 13.

Considering the process of producing the device 10 as shown in FIG. 3A, initially, conventional FOX structures 20L and 20R were formed on substrate 11 in accordance with one of the processes well known to those skilled in the art.

Then gate oxide layer 13 was formed upon the substrate 11 between FOX regions 20L and 20R, in accordance with a conventional process well known to those skilled in the art.

Next, an active region photoresist mask 7 was formed over the FOX structures 20L and 20R and the gate oxide layer 13, with an opening 19 over the gate oxide layer 13. As shown in FIG. 3A, an ion implantation of N+ ions 8, through opening 19 in mask 7, is performed on device 10 to form an N+ active region 12 located between the FOX regions 20L and 20R and below the gate oxide layer 13. The ion implantation of N+ ions 8 includes a dose of arsenic (As$^+$) ions implanted within the range from about $5 \times 10^{14}$/cm$^2$ to about $5 \times 10^{15}$/cm$^2$ at from about 50 keV to about 120 keV.

Subsequently, the photoresist mask 7 is removed leaving the surfaces of the FOX regions 20L and 20R and the surface of gate oxide layer 13 exposed.

Figure 3B:
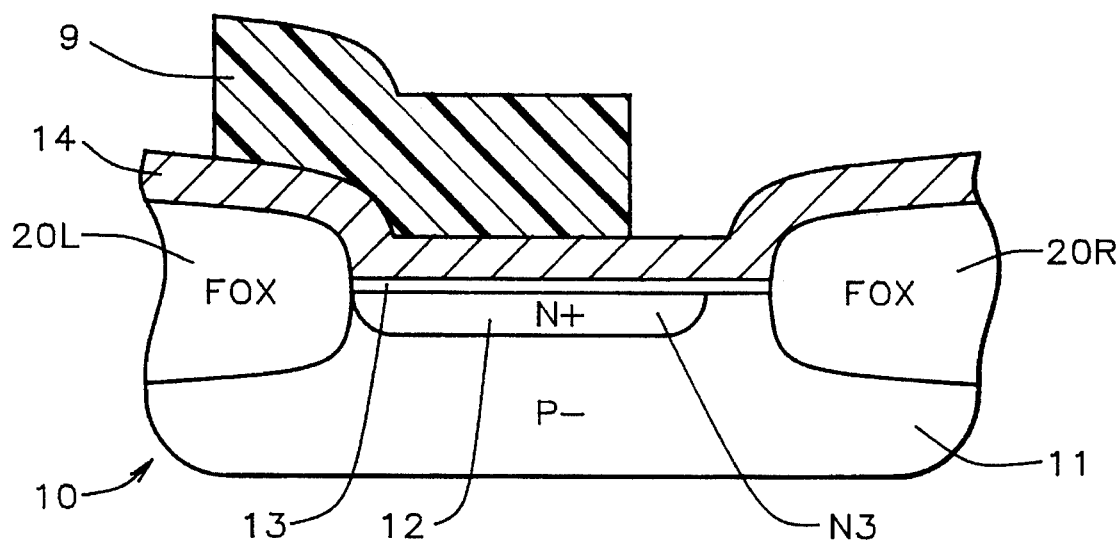

FIG. 3B shows the product of FIG. 3A with a blanket layer of a first polysilicon layer 14 deposited over the entire device including the FOX structures 20L and 20R. Then a gate mask 9 with predetermined openings therein is formed. Gate mask 9 was patterned from a blanket photoresist layer by use of a conventional photolithographic technique. Then, exposed portions of said first polysilicon layer 14 are selectively etched away through openings in said mask 9 by one of the etching techniques well known by those skilled in the art.

Figure 3C:
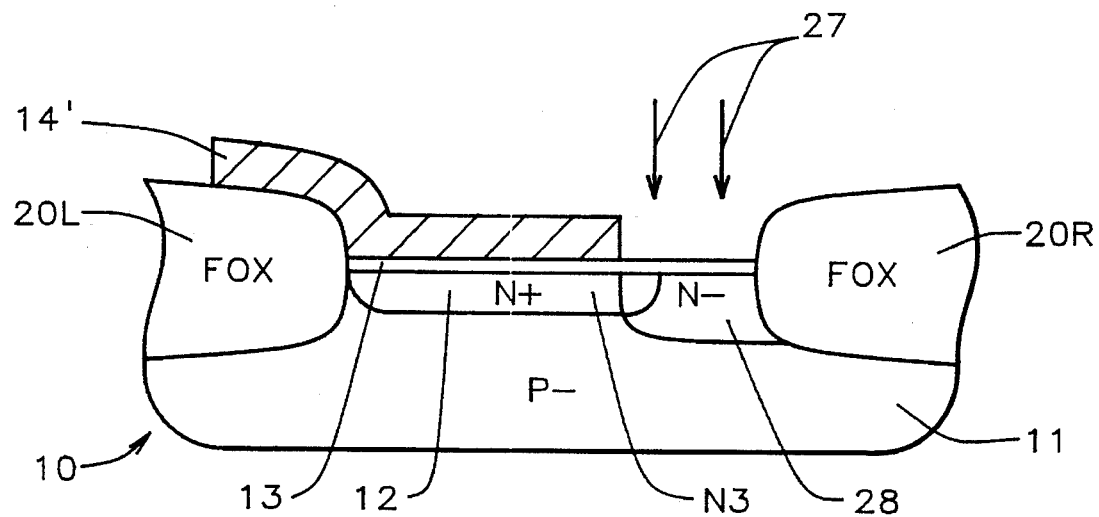

FIG. 3C shows the product of FIG. 3B with the first polysilicon layer 14 patterned into gate electrode 14' by etching the surfaces exposed aside from the mask 9. The result is the gate electrode 14' which extends from covering a portion of the FOX region 20L on the left, and extending over most of the N+ region 12. Subsequent to the etching of polysilicon layer 14 to form gate electrode 14', the mask 9 was removed.

The next step in the process is an N– (lightly doped) ion implantation of ions 27 into region 28 which was performed using first polysilicon gate electrode 14' as a self-aligned mask, with FOX regions 20L and 20R defining the lateral margins of region 28 on the right and left of the gate electrode 14'.

The N– ion implantation into region 28 is made in accordance with a conventional N-LDD (Lightly Doped Drain) process to form the N– region 28 to the right of gate electrode 14' and to the left of the FOX region 20R on the right side of device 10. The N– ion implantation into region 28 includes a dose of P$^{31}$ ions 27 implanted within the range between about $1 \times 10^{13}$/cm$^2$ and about $5 \times 10^{13}$/cm$^2$ at between about 40 keV and about 80 keV.

Figure 3D:
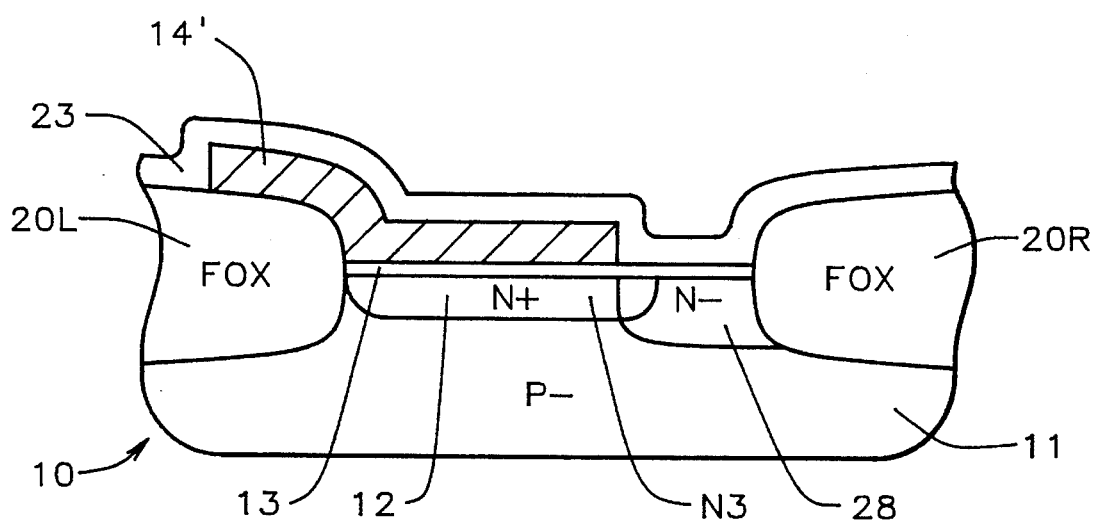

FIG. 3D shows the product of FIG. 3C after a blanket deposition of silicon dioxide spacer layer 23 deposited by CVD over gate electrode 14', the exposed portion of gate oxide layer 13 over N– region 28, and over FOX region 20R (on the right) and that portion of the FOX region 20L (on the left) which is exposed (since a portion thereof is covered by gate electrode 14'.)

Figure 3E:
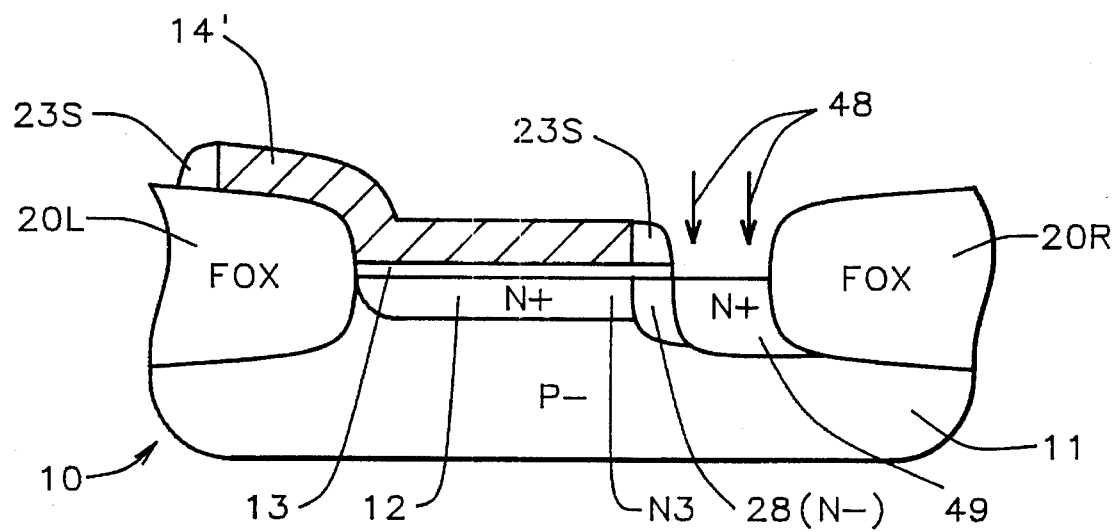

FIG. 3E shows the product of FIG. 3D after portions of the spacer layer 23 is etched by a spacer etchback process leaving conventional spacer structures 23S in place. The spacer etchback process opens the gate oxide layer 13 down to the substrate 11 above the portion of region 28 between the spacer 23S, on the left, (next to gate electrode 14') and FOX region 20R, on the right, exposing that portion of the the top surface of N+ region 12 and particularly above the N+ region 49 on the right side of region 28.

Subsequently N+ ions 48 are ion implanted to form a new N+ region 49 in region 28 using gate electrode 12 and spacer 23S as a self-aligned mask protecting N+ region 12 and the remainder of region 28 from implantation with ions 48. This N+ ion implantation includes a dose of arsenic (As) ions 48 implanted within the range between about $1 \times 10^{15}$/cm$^2$ and about $5 \times 10^{15}$/cm$^2$ at between about 50 keV and about 100 keV.

The purpose of doping region 49 is the same as the conventional N+ S/D implantation forming an active region.

Figure 3F:
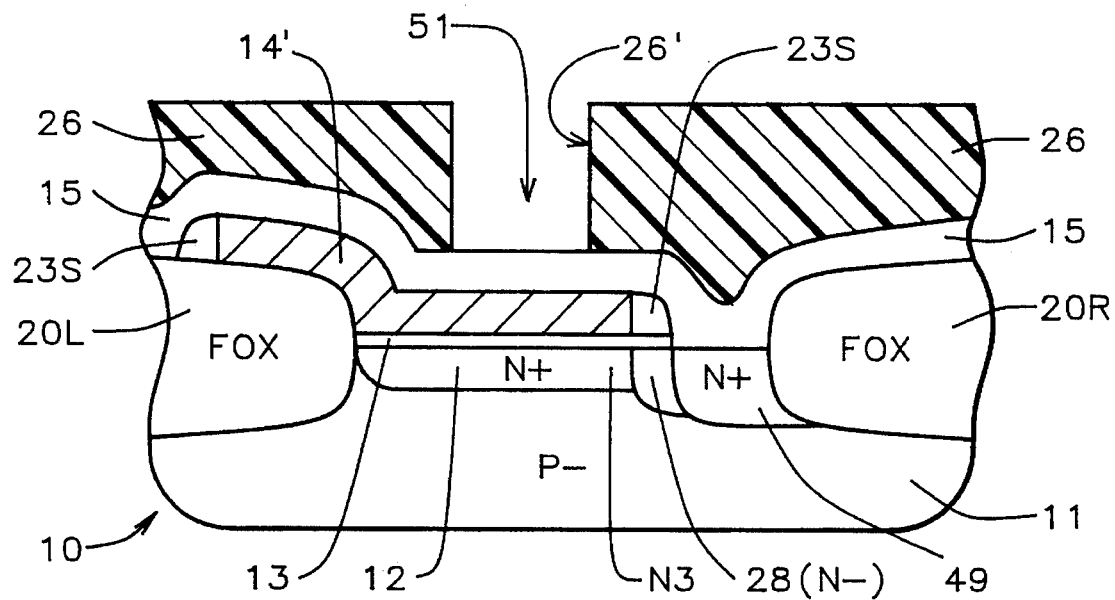

Next, as shown in FIG. 3F, a blanket inter-polysilicon oxide layer 15 is deposited on the product of FIG. 3E.

Then after layer 15 is deposited, the following step shown is formation of a photoresist layer 26 over inter-polysilicon oxide layer 15 with an opening 26' therein.

Next mask 26 with opening 26' therein is used to admit an etchant for etching a deep butting contact opening 51 through oxide layer 15, through first polysilicon layer 14 and through gate oxide layer 13 down to expose a portion of the surface of N+ region 12 of the substrate 11.

Figure 3G:
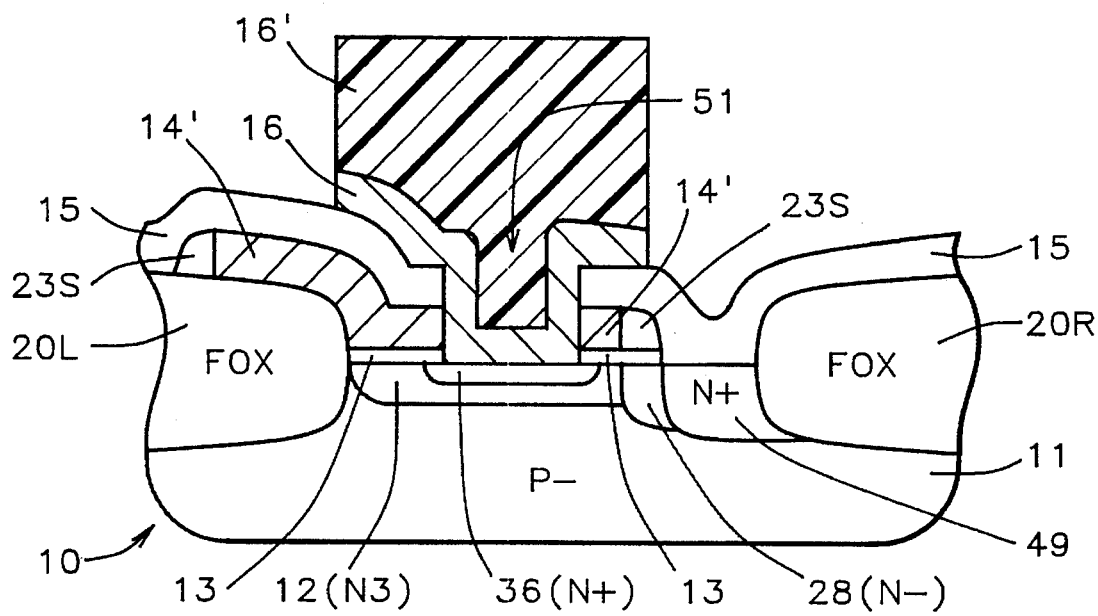

Subsequently, the resist mask 26 is removed, as shown in FIG. 3G which shows the device of FIG. 3F after the mask 26 was removed with the location of butting contact opening 51 indicated.

Referring to FIG. 3G, a second polysilicon layer 16 was deposited upon the product of FIG. 3F after the mask 26 was removed. Second polysilicon layer 16 was deposited over layer 15 extending down into butting contact opening 51.

Then layer 16 is covered with a photoresist mask 16' patterned by conventional photolithographic means to provide protection of the region above butting contact opening 51. Then the portion of layer 16 unprotected by mask 16' was etched away by means of a conventional etching process removing the portions of second polysilicon layer 16 not covered by mask 16'. Then mask 16' is removed leaving butting contact 16.

Figure 3H:
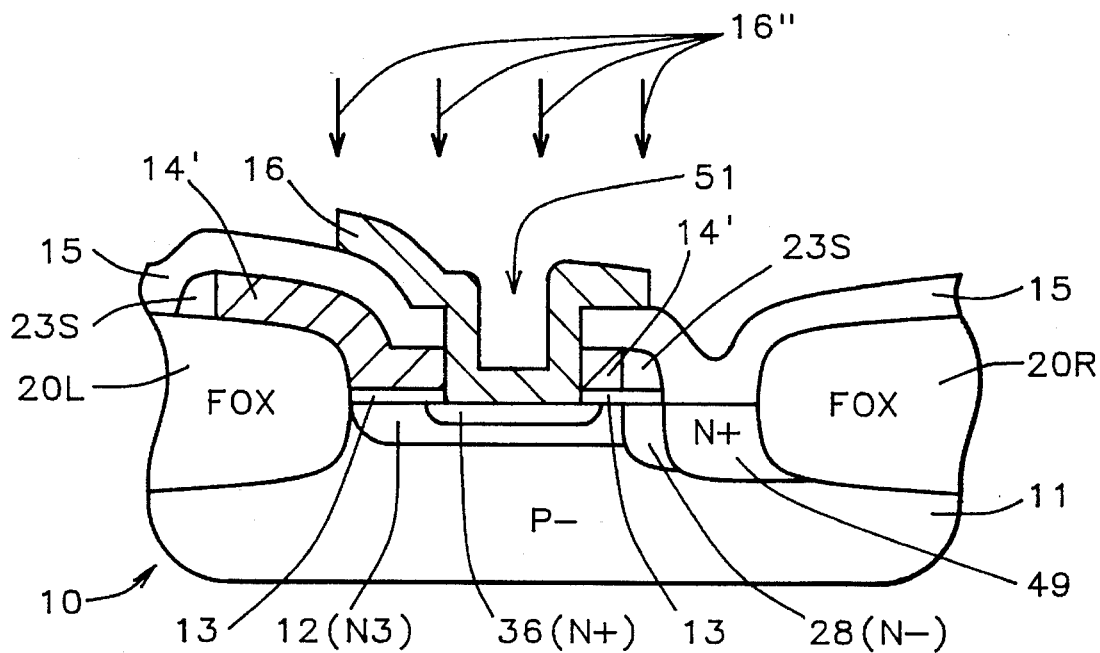

FIG. 3H shows the product of FIG. 3G after the removal of mask 16'. At this point, the butting contact 16, is doped by ions 16" in an ion implantation step. The ion implantation into butting contact 16 includes a dose of arsenic (As) ions 16" implanted within the range between about $5\times10^{14}/cm^2$ and about $5\times10^{15}/cm^2$ at between about 50 keV and about 80 keV.

Figure 4:
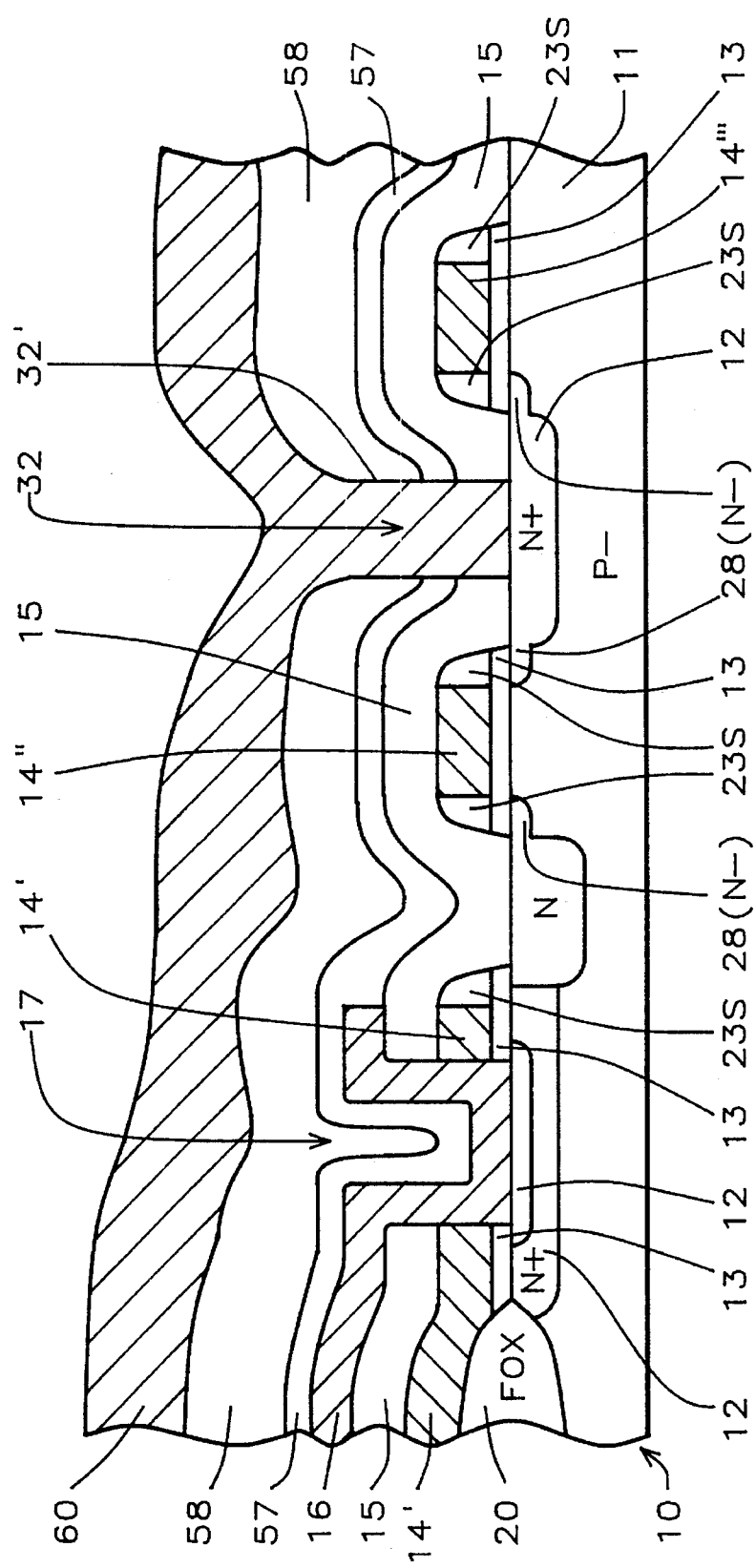
FIG. 4 shows a cross-sectional schematic view of a device 10 in accordance with this invention taken along line 4—4 in FIG. 8.

FIG. 4 shows a cross-sectional schematic view of a device 10 in accordance with this invention taken along line 4—4 in FIG. 8. The device 10 includes substrate 11 comprising a P doped silicon semiconductor. A pair of N+ doped regions 12 and 12' are formed in the substrate 11 on the left and on the right, respectively. Over the substrate 11 and a portion of the N+ region 12 is formed a gate oxide layer 13, but over N+ region 12', gate oxide layer 13 is absent. Upon most of the gate oxide layer 13 was deposited a first polysilicon layer 14 in what was originally a blanket polysilicon layer. Subsequently, the first polysilicon layer was patterned into three first polysilicon sections 14', 14" and 14'". At the ends of each of the first polysilicon sections 14', 14" and 14'", silicon dioxide spacers 23S lie over the gate oxide layer 13. First polysilicon sections 14', 14" and 14'" and spacers 23S are, in turn, coated by a silicon dioxide (dielectric) layer 15. A hole 17 formed through layer 13, section 14' and layer 15 extends therethrough down to substrate 11, with hole 17 located above the N+ doped region 12, exposing a portion of N+ doped region 12 to second polysilicon layer 16. Layer 16 is formed over the silicon dioxide layer 15 and reaches down, i.e. extends down, through hole 17 into mechanical and electrical contact with the exposed portion of N+ doped region 12 of substrate 11, so that second polysilicon layer 16 forms a butting contact between the N+ region 12 below layer 16 and contact with the first polysilicon section 14' which is contacted by the sidewalls of the second polysilicon layer 16, as it reaches down into hole 17.

The second polysilicon layer 16 is, in turn, coated with a blanket layer 57 of USG (undoped silicon glass, i.e. silicon dioxide) and a blanket layer 58 of BPSG (Borophosphosilicate glass).

An opening 32 has been formed through the USG layer 57 and BPSG layer 58 as well as silicon dioxide layer 15 extending down to expose a portion of the surface of N+ region 12'.

A metal bit line layer 60 is deposited on BPSG layer 58 with forming a via 32' extending through opening 32 in the BPSG layer 58 down to form an electrical and mechanical contact to N+ region 12'.

The purpose of performing the doping of N− regions 28 is, according to cell layout, that region 12 does not cover the areas covered by N− doped regions 28. N− doped regions 28 are the source/drain S/D regions for connect transistors (for which gate 14" is the gate) with region 12.

Figure 5:
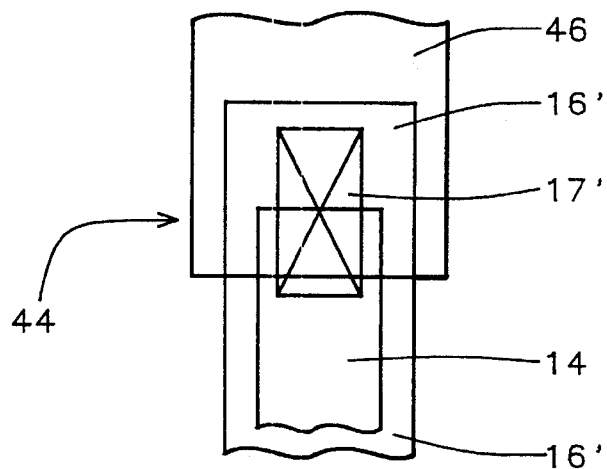
FIG. 5 shows a schematic plan view of a prior art butting contact of polysilicon with a butting contact opening and first polysilicon line.

FIG. 5 shows a schematic plan view of a prior art device with a butting contact 44. Contacts 44 includes a butting contact opening 17', a first polysilicon line 14' a second polysilicon line 16', and active region 46.

Figure 6:
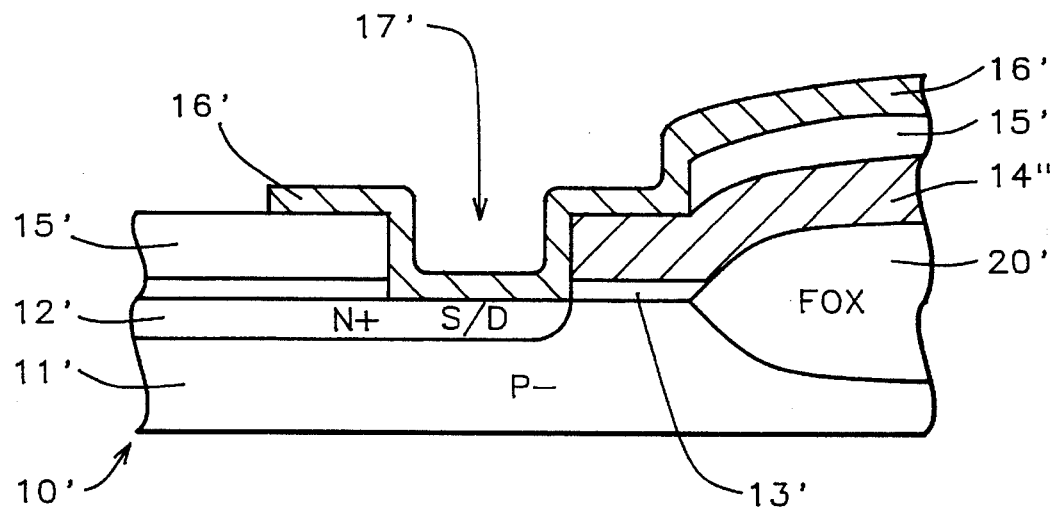
FIG. 6 shows a sectional view of a prior art semiconductor device including a substrate comprising a P doped silicon semiconductor.

FIG. 6 shows a sectional view of a prior art semiconductor device 10' including a P doped silicon semiconductor substrate 11' with an N+ region 12' formed in the surface of substrate 11'. Formed upon the substrate 11' to the right of region 12' are a FOX region 20' and a gate oxide layer 13'. Upon the gate oxide layer 13' is formed a first polysilicon layer 14", which, in turn, is coated by silicon dioxide layer 15'. A hole 17' has been formed in layers 13', 14" and 15' down to N+ region 12' formed in the surface of substrate 11'. A second polysilicon layer 16' has been deposited over the silicon dioxide layer 15' and down into hole 17' over the N+ region 12' in substrate 11' forming a butting contact between N+ region 12' and the second polysilicon layer 16', as well as contact with first polysilicon layer 14".

Figure 7:
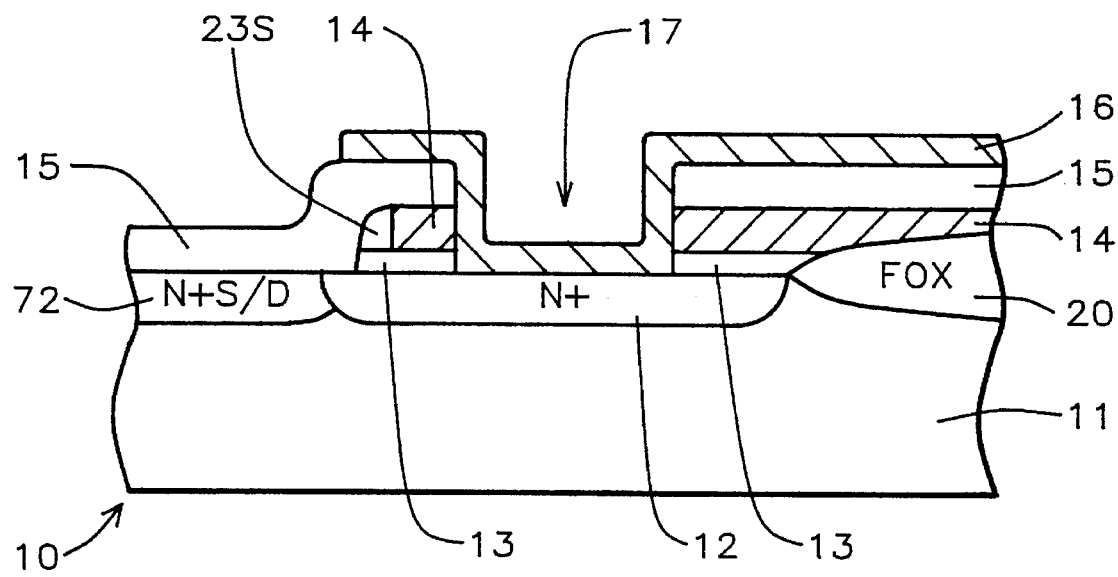
FIG. 7 shows a semiconductor device 10 with a cross sectional view of a butting arrangement in accordance with the current invention, similar to the design in FIG. 2.

FIG. 7 shows a semiconductor device 10 with a cross sectional view of a butting arrangement in accordance with the current invention, similar to the design in FIG. 2. The device 10 includes a substrate 11 comprising a P doped silicon semiconductor. An N+ region 12 is formed in the substrate 11. Upon the substrate 11 is formed gate oxide layer 13. Upon the gate oxide layer 13 is formed a first polysilicon layer 14, which in turn is coated by silicon dioxide layer 15. A hole or opening 17 is formed over N+ region 12 extending down through layers 13, 14 and 15 down to substrate 11 to the surface of N+ region 12. A second polysilicon layer 16 has been deposited over the silicon dioxide layer 15 reaching down into hole 17 over the N+ region 12 of substrate 11 forming a butting contact between the N+ region 12 and the second polysilicon layer 16 and forming a contact to first polysilicon layer 14.

FIG. 8 shows a representational plan view of a device 10 made in accordance with this invention embodying the circuit of FIG. 1. In FIG. 8, the elements of the circuit of FIG. 1 are indicated by similar numbers. The buried N+ masks 70 and 70' for an active area and the butting contact masks 71 and 71' are indicated by the lines shown. An active mask 62 is provided also.

FIGS. 10A–10H illustrate another method of forming a butted contact useful in an SRAM device 110 or in a like device. FIGS. 10A–10H also illustrate the device produced by the method of this invention.

Figure 10A:
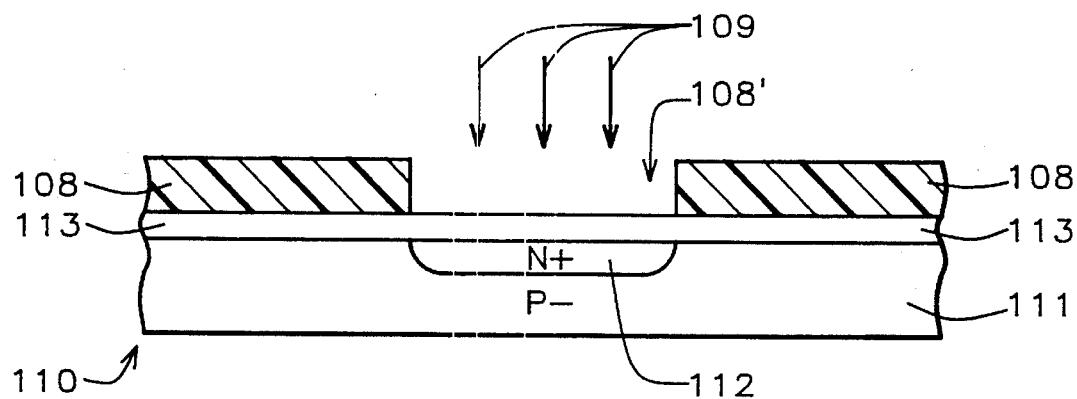
FIGS. 10A–10H illustrate another method of forming a butted contact useful in an SRAM device or in a like device, and FIGS. 10A–10H also illustrate the device produced by the method of this invention.

Referring to FIG. 10A, device 110 is formed on a semiconductor substrate 111 with a flat upper surface upon which a blanket gate oxide layer 113 is formed over the active surface regions of substrate 111 (which are separated from one another by FOX regions, not shown, such as FOX regions 20 in FIGS. 3A–3H.) A doped N+ region 112 is formed in certain of the active regions by means of ion implantation with ions 109 introduced through an opening 108' in photoresist mask 108 and implanted through the gate oxide layer 113 into region 112. Then mask 108 is stripped from device 110.

Figure 10B:
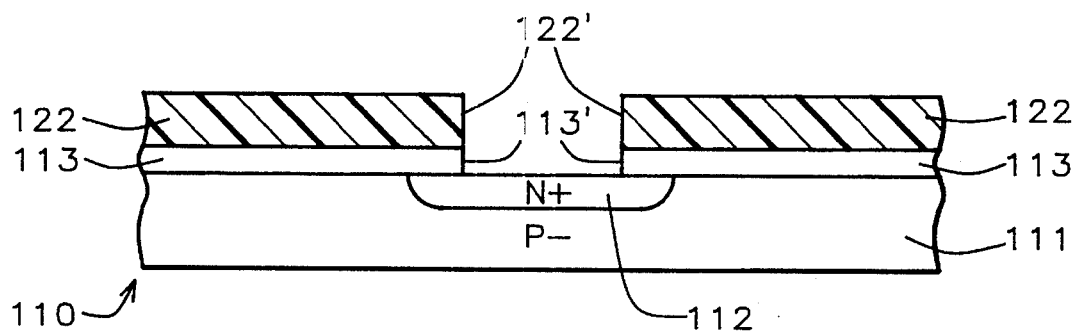

Then as shown in FIG. 10B, a new mask 122 is applied to the surface of device 10A and portions of the gate oxide layer 113 are then removed by etching through an opening 122' in mask layer 122. Photoresist mask layer 122 is deposited upon the surface of mask layer 122. Conventional photolithography is used to pattern mask layer 122 with a patterned opening 122' therethrough, located over doped N+ region 112, which is used for the etching gate oxide layer 113 to form opening 113' therethrough extending down to expose a portion of N+ doped region 112 in silicon substrate 111. Then mask 122 is removed from device 110.

Figure 10C:
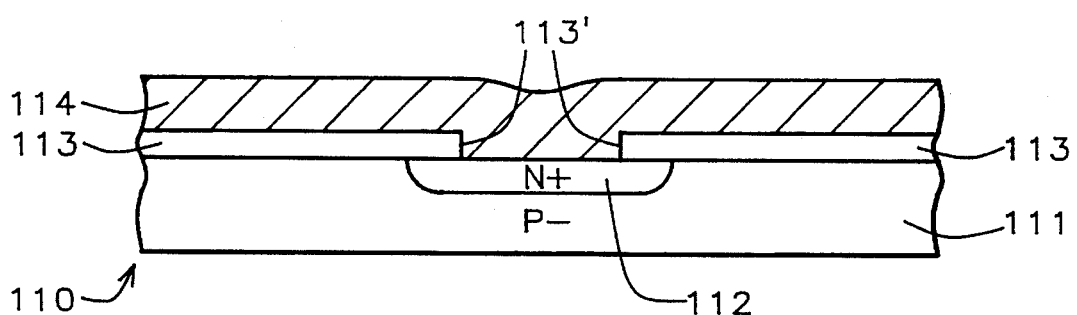

Referring to FIG. 10C, device 110 is shown after deposition of a first conductive layer 114 thereon. Layer 114 is composed of a material such as doped polysilicon, deposited over what remains of layer 113 and extending down through opening 113' into electrical and physical contact with the exposed portion of the surface of the N+ region 112 in substrate 111.

Figure 10D:
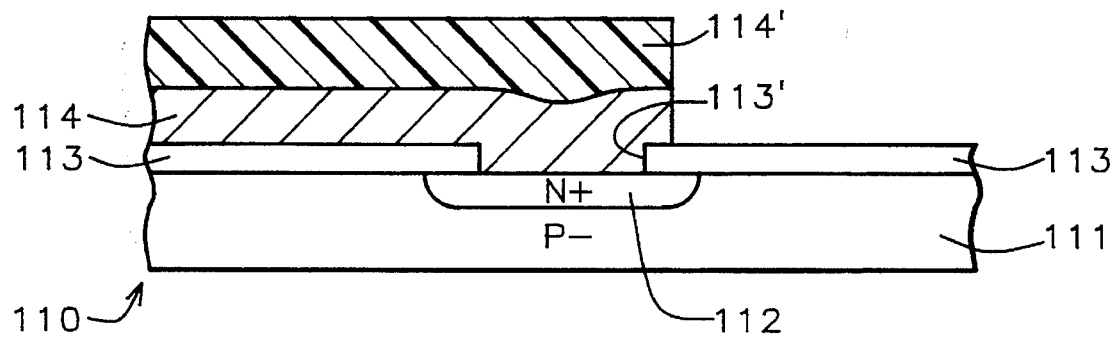

Referring to FIG. 10D, the layer 114 is then patterned using a conventional lithographic mask 114' which covers the portion of layer 114 over the opening 113' and overlapping region 112 having an edge inside of and near the right end boundary of N+ region 112. The remainder of layer 114, unprotected by mask 114' starting somewhat to the right of opening 113' has been removed by etching layer 114 away down to layer 113.

Figure 10E:
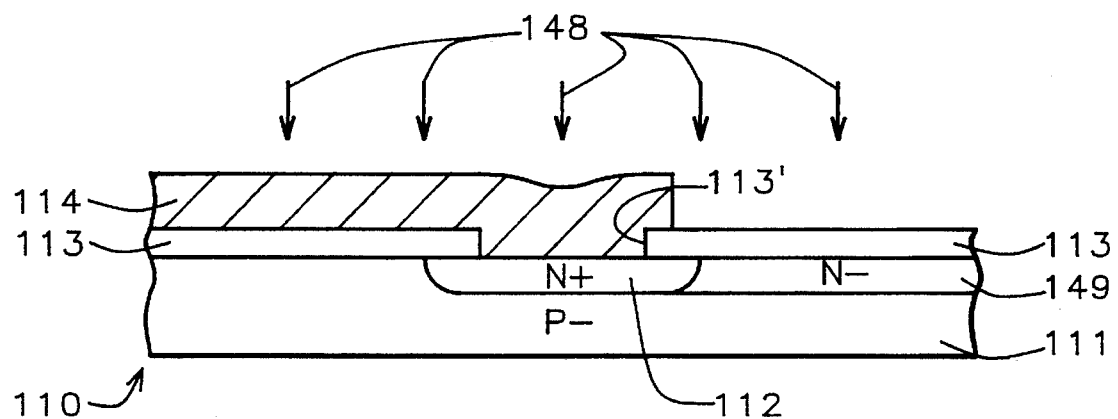

Referring to FIG. 10E, a lightly doped ion implant of N– ions 148 doping region 149 with N– impurities is made into the substrate 111 adjacent to at least one patterned edge of the first conductor to from N– region 149.

Figure 10F:
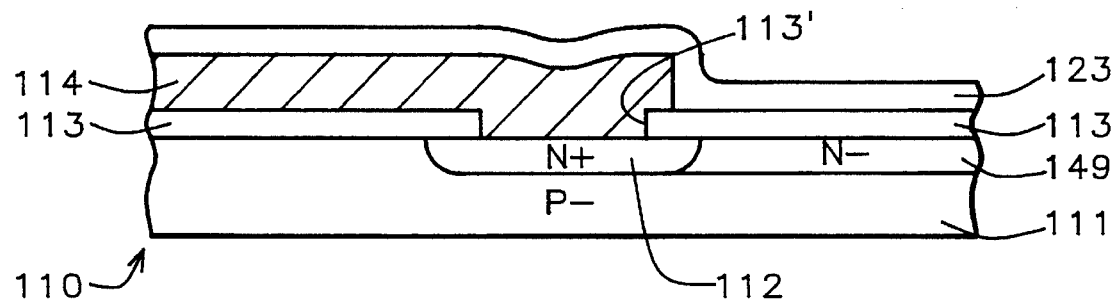

Referring to FIG. 10F, the device of FIG. 10E is shown after a blanket dielectric spacer layer 123 was deposited upon device 111. The spacer layer 123 can is composed of a dielectric material, e.g. silicon oxide, silicon nitride or the like.

Figure 10G:
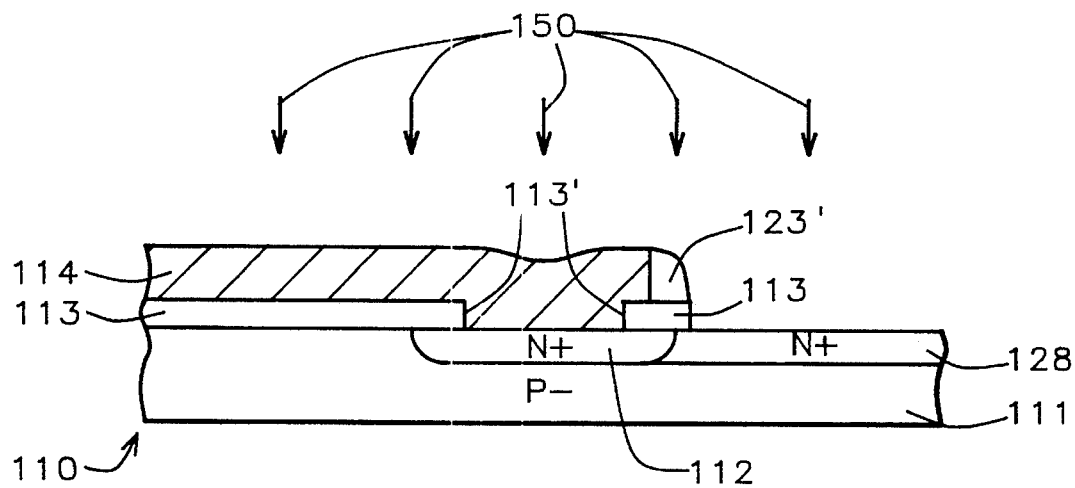

Referring to FIG. 10G, the device of FIG. 10F is shown after a dielectric spacer 123' was formed by the technique of uniform deposition of and anisotropic etching of dielectric layer 123 to produce dielectric spacer 123' over the right edge of region 112. Using layer 114 and spacer 123' as a mask, to prevent ion implantation therebelow into substrate 111, N+ dopant ions 150 are implanted into the substrate 111. As a result, N+ doped region 128 is formed in the surface of substrate 111 to the right of spacer 123' by ion implantation of N+ impurities leaving a spacing thereon. The N+ region 128 is in contiguous relationship to the N+ region 112, in juxtaposition therewith, to the right thereof.

Figure 10H:
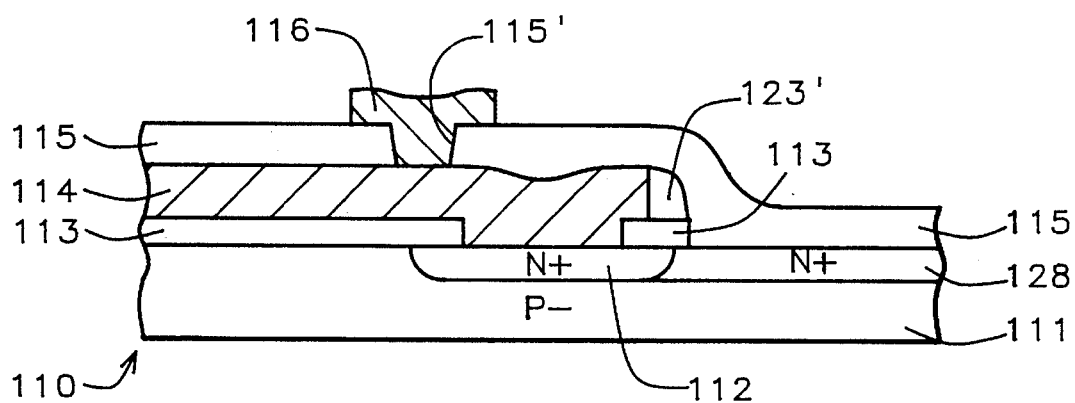

Referring to FIG. 10G, a blanket dielectric layer 115 is then deposited over the patterned first conductor 114, spacer 123' and N+ region 128. Then an opening 115' is made through dielectric layer 115 down to the top surface of conductive layer 114 by photolithography and etching. A second conductive layer 116 is deposited over layer 115 extending down through the opening 115' to make electrical/physical contact to first conductor layer 114 as seen in FIG. 10H. The layer 116 is shown after it has been patterned into a contact 116 over the opening 115'.

Process in Accordance with this Invention

Method 1

Butting Contact from Polysilicon 1 to N+ active Node N4, node N3, N3'(FIG. 8 and FIGS. 10A–10H.)

Features of the Method 1 process are as follows:
1. A LOCOS field oxide layer 20 is formed and then a sacrificial oxide layer is grown.
2. Removal of the sacrificial oxide and growing a gate oxide layer 13, 13' in its place.
3. Defining a buried N+ mask by a lithographic process.
4. Performing a buried N+ implant (i.e. As+ 80 keV, 1E15 $cm^{-2}$) to form N+ regions 12, 12'.
5. Etching of gate oxide layer 13, by buried contact mask.
6. Deposition of first polysilicon (Polysilicon or polycide) layer 14.
7. Following the conventional lithography and etching process to define first polysilicon as the gate structures 14, 14', and 14", as described above.
8. For N3 and N4, deposit a silicon oxide layer 15/115 and make an opening by lithography and etching through layer 15/115 to the first polysilicon layer 14/114. Then deposit a second polysilicon layer thereover as seen in FIG. 10E for nodes N3 and N4.

Method 2

Butting Contact Process

Polysilicon 2 direct contact N+ active and contact with first polysilicon through first polysilicon sidewall
Node 1, node 2

Use second polysilicon butting contact for nodes N3 and N4 in FIG. 8.

Use the first polysilicon butting contact as in method 1.

The second polysilicon butting contact process uses second polysilicon in direct contact with the N+ active region 12, 12' as well as contact with first polysilicon through first polysilicon sidewall as shown in FIGS. 3D, 4, and 7.

Features of the Method 2 process are as follows:
1. Formation by LOCOS of field oxide regions 20.
2. Grow sacrificial oxide.
3. Buried N+ mask and implantation before first polysilicon formation.
4. Then follow conventional process to form first polysilicon layer 14 and to define first polysilicon into gates 14, 14' and 14".
5. After first polysilicon formation and definition, then CVD oxide deposition for first polysilicon/second polysilicon insulator (CVD silicon dioxide layer 15).
6. Polysilicon 2 butting contact mask (Nodes N4, N3)
7. Etch the CVD oxide layer 15 on first polysilicon layer 14 and then etch first polysilicon layer 14, then etch gate oxide layer 13.
8. Deposit second polysilicon layer 16 and form a mask for patterning second polysilicon layer 16. Then perform the patterning of second polysilicon layer 16 by etching.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of an SRAM cell comprising:

forming a gate oxide layer on a semiconductor substrate doped with a dopant of a first conductivity type with a field oxide region on at least one end of said gate oxide layer, forming a first mask over said semiconductor substrate including said field oxide region and said gate oxide layer with a mask opening located over said gate oxide layer, performing a first ion implantation of ions through said mask opening into said substrate to form a first highly doped region of an opposite conductivity type from said dopant of said first conductivity type in said substrate located below said gate oxide layer, removing said first mask, forming a first conductive layer upon said gate oxide layer, forming a first electrode mask over said first conductive layer leaving unwanted portions of said first conductive layer exposed, etching away said unwanted portions of said first conductive layer exposing portions of said gate oxide layer below said unwanted portions of said first conductive layer providing a first gate electrode of said SRAM cell formed from said first conductive layer over said first highly doped region, said gate electrode having a top surface, forming a spacer on said exposed gate oxide at an edge of said first gate electrode, removing said first electrode mask and forming a lightly doped region adjacent to said first highly doped region, then depositing a blanket dielectric layer over said cell including said top surface of said first gate electrode, forming a third mask over said dielectric layer with an opening therein leaving an unwanted portion of said dielectric layer exposed said opening being located above said top surface of said gate electrode, etching through said opening in third mask to remove said unwanted portion of said dielectric layer thereby exposing a newly exposed portion of said top surface of said first gate electrode, and then etching through said newly exposed portion of said first gate electrode thereby exposing a newly exposed portion of said gate oxide layer and then etching through said newly exposed portion of said gate oxide layer down to said first highly doped region in said substrate thereby forming a butting contact opening therein, forming a second conductive layer upon said dielectric layer extending down through said butting contact opening into contact with said first gate electrode and into contact with said first highly doped region.

2. The method of claim 1 wherein after removing of said first electrode mask, performing a lightly doped ion implantation forming a lightly doped region in said substrate adjacent to said first highly doped region using said first gate electrode as a self-aligned mask, said doping of said lightly doped region including a dose of N-type ions implanted within the range between about $1\times10^{13}/cm^2$ and about $5\times10^{13}/cm^2$ at between about 40 keV and about 80 keV.

3. A method in accordance with claim 1 wherein said dopant of said first conductivity type is P type impurity.

4. A method in accordance with claim 3 wherein said dopant of said opposite conductivity type from said first conductivity type is N type impurity.

5. A method in accordance with claim 2 wherein a spacer is formed adjacent to the edge of said first conductive layer, on said gate oxide layer subsequent to said lightly doped ion implantation.

6. A method in accordance with claim 5 wherein additional dopants are implanted into said substrate adjacent to said lightly doped region aside from said spacer using said first gate electrode combined with said spacer as a self-aligned mask to protect portions of said substrate including said first highly doped region and a portion of said lightly doped region from said additional dopants.

7. A method in accordance with claim 6 wherein said first highly doped region is formed adjacent to said field oxide regions.

8. A method of manufacture of an SRAM cell comprising:

forming a gate oxide layer on a semiconductor substrate doped with a dopant of a first conductivity type, forming a first mask over said semiconductor substrate including said gate oxide layer with a mask opening located over said gate oxide layer, performing a first ion implantation of ions through said mask opening into said substrate to form a first highly doped region of an opposite conductivity type from said first conductivity type of dopant in said semiconductor substrate located below said gate oxide layer, removing said first mask, forming a first conductive layer upon said gate oxide layer, forming a gate electrode mask over said first conductive layer leaving unwanted portions of said first conductive layer exposed, etching away said unwanted portions of said first conductive layer exposing portions of said gate oxide layer below said unwanted portions of said first conductive layer providing a gate electrode of said SRAM cell, said gate electrode having a top surface, removing said gate electrode mask, forming a spacer on said exposed gate oxide at an edge of said gate electrode, and forming a highly doped region adjacent to said first highly doped region, forming an additional blanket dielectric layer over said cell covering said cell including said gate electrode and said lightly doped region, forming a third mask over said additional blanket dielectric layer with an opening therein leaving an unwanted portion of said additional blanket dielectric layer exposed, said opening being located above said top surface of said gate electrode, etching through said opening in said third mask an opening through said unwanted portion of said additional blanket dielectric layer, a hole therebelow through said gate electrode and a hole therebelow through said gate oxide layer down to said first highly doped region in said substrate through said opening in said third mask forming a butting contact opening therein, and forming a second conductive layer upon said additional blanket dielectric layer extending down through said butting contact opening into contact with gate electrode and said first highly doped region.

9. The method of claim 8 wherein after removing said first electrode mask a second ion implantation is performed forming a lightly doped region in said substrate adjacent to said first highly doped region using said gate electrode as a self-aligned mask.

10. A method in accordance with claim 9 wherein following removing of said gate electrode mask a dielectric spacer layer is deposited over said semiconductor substrate, etching said dielectric spacer layer to form a spacer from said dielectric spacer layer at an end of said gate electrode and to strip portions of said gate oxide layer, performing an additional ion implantation of ions to said substrate to form a second highly doped region of an opposite conductivity type from said first conductivity type located in said substrate below said gate oxide layer, aside from said spacer using said gate electrode combined with said spacer as a self-aligned mask to protect portions of said substrate including said first highly doped region from said additional ions, and when said additional blanket dielectric layer is deposited said additional blanket dielectric layer covers said spacer and said lightly doped region and second highly doped region.

11. A method in accordance with claim 8 wherein said dopant of said first conductivity type is P type impurity.

12. A method in accordance with claim 8 wherein said dopant of said opposite conductivity type is N type impurity.

13. A method in accordance with claim 1 wherein said first ion implantation includes a dose of arsenic (As) ions implanted within the range between about $5\times10^{14}/cm^2$ and about $5\times10^{15}/cm^2$ at between about 50 keV and about 120 keV.

14. A method in accordance with claim 8 wherein said first ion implantation includes a dose of arsenic (As) ions implanted within the range between about $5 \times 10^{14}/cm^2$ and about $5 \times 10^{15}/cm^2$ at between about 50 keV and about 120 keV.

15. A method in accordance with claim 1 wherein said first ion implantation includes a dose of arsenic (As) ions implanted within a range between about $5 \times 10^{14}/cm^2$ and about $5 \times 10^{15}/cm^2$ at between about 50 keV and about 120 keV, following removing said first electrode mask by forming a lightly doped region in said substrate adjacent to said first highly doped region using said first electrode as a self-aligned mask, said lightly doped region being formed by ion implantation with a dose of $P^{31}$ ions implanted within a range between about $1 \times 10^{13}/cm^2$ and about $5 \times 10^{13}/cm^2$ at between about 40 keV and about 80 keV.

16. A method in accordance with claim 8 wherein said first ion implantation includes a dose of arsenic (As) ions implanted within a range between about $5 \times 10^{14}/cm^2$ and about $5 \times 10^{15}/cm^2$ at between about 50 keV and about 120 keV, following removing said gate electrode mask by forming a lightly doped region in said substrate adjacent to said first highly doped region using said first electrode as a self-aligned mask, said lightly doped region being formed by ion implantation with a dose of $P^{31}$ ions implanted within a range between about $1 \times 10^{13}/cm^2$ and about $5 \times 10^{13}/cm^2$ at between about 40 keV and about 80 keV.

17. A method in accordance with claim 1 wherein said first ion implantation includes a dose of arsenic (As) ions implanted within the range between about $5 \times 10^{14}/cm^2$ and about $5 \times 10^{15}/cm^2$ at between about 50 keV and about 120 keV, then after removing said first electrode mask, forming a lightly doped region in said substrate adjacent to said first highly doped region, said lightly doped region being formed by ion implantation with a dose of $P^{31}$ ions implanted within a range between about $1 \times 10^{13}/cm^2$ and about $5 \times 10^{13}/cm^2$ at between about 40 keV and about 80 keV using said first electrode as a self-aligned mask, performing a second highly doped ion implantation of ions into said substrate to form a second highly doped region of an opposite conductivity type to said first conductivity type located in said substrate below said gate oxide layer, aside from said spacer using said first electrode combined with said spacer as a self-aligned mask to protect portions of said substrate including said lightly doped region from an additional level of dopant, and said second highly doped region is formed by ion implantation with a dose of arsenic (As) ions implanted within a range between about $1 \times 10^{15}/cm^2$ and about $5 \times 10^{15}/cm^2$ at between about 50 keV and about 100 keV.

18. A method in accordance with claim 9 wherein a spacer is formed adjacent to the edge of said first conductive layer, on said gate oxide layer subsequent to said lightly doped ion implantation.

19. A method of manufacture of an SRAM cell comprising:

forming a gate oxide layer on a semiconductor substrate doped with a dopant of a first conductivity type with field oxide regions on either end of said gate oxide layer, forming a first mask over said field oxide regions and said gate oxide layer with a first mask opening located over said gate oxide layer, performing an ion implantation of second conductivity type impurities through said first mask opening into said substrate to form a first highly doped region of second conductivity type impurities located below said gate oxide layer, removing said first mask, forming a conductive gate electrode layer of said SRAM cell upon said gate oxide layer, forming a gate electrode mask over said conductive gate electrode layer leaving unwanted areas of said conductive gate electrode layer exposed, etching away said unwanted areas of said conductive gate electrode layer to form a gate electrode with a patterned edge superjacent said first highly doped second conductivity type region, ion implanting a lightly doped second conductivity type region in said substrate adjacent to said first highly doped second conductivity type region and said patterned edge of said first gate electrode which serves as a self-aligned mask, forming a dielectric spacer on said patterned edge of said gate electrode, performing an ion implantation of second conductivity type impurities forming a second highly doped region of second conductivity type impurities in said substrate adjacent to said first highly doped second conductivity type region and said patterned edge and said spacer with said second highly doped region of second conductivity type impurities located contiguous to said lightly doped second conductivity type region on the other side from said first highly doped second conductivity type region, depositing a dielectric layer after forming said second highly doped second conductivity type region, forming a second mask over said dielectric layer with an opening therein leaving an unwanted portion of said dielectric layer exposed, etching through said opening in said second mask to remove said unwanted portion of said dielectric layer and then etching through an exposed portion of said gate electrode and then etching through an exposed portion of said gate oxide layer down to said first highly doped second conductivity type region in said substrate thereby forming a butting contact opening therein, forming a conductive layer upon said dielectric layer extending down through said butting contact opening into contact with said gate electrode and into contact with said first highly doped second conductivity type region.

\* \* \* \* \*